(12) United States Patent
Satoh

(10) Patent No.: US 6,477,672 B1
(45) Date of Patent: Nov. 5, 2002

(54) MEMORY TESTING APPARATUS

(75) Inventor: Kazuhiko Satoh, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/400,717

(22) Filed: Sep. 21, 1999

(30) Foreign Application Priority Data

Sep. 21, 1998 (JP) .......................................... 10-266332

(51) Int. Cl.[7] .............................................. G11C 29/00
(52) U.S. Cl. ...................................... 714/721; 714/738
(58) Field of Search .................................. 714/721, 719, 714/738, 57, 723, 737, 54, 732–736, 5, 7, 42, 720, 754; 235/443; 365/230.06, 189.02, 200–201, 225.7, 230.02; 711/100, 105, 165, 164, 208; 710/263; 257/392, 402, 410, 406, 411; 324/73.1

(56) References Cited

U.S. PATENT DOCUMENTS 5,790,559 A * 8/1998 Sato ........................... 714/720
5,862,088 A * 1/1999 Takemoto et al. .......... 365/201
6,154,862 A * 11/2000 Tabata et al. ............... 714/719

OTHER PUBLICATIONS

Test Time Data Volume Reduction Technique; IBM Tech. Discl. Bulletin, vol. 24, No. 5, Oct. 1981 at pp. 2560–2562, NN81102560.*

* cited by examiner

*Primary Examiner*—Albert Decady
*Assistant Examiner*—Guy Lamarre
(74) *Attorney, Agent, or Firm*—David N. Lathrop, Esq.; Gallagher & Lathrop

(57) ABSTRACT

A memory testing apparatus is provided, which can test in short time a memory having a block function like a flash memory. In addition to a failure analysis memory AFM capable of storing failures of all bits of a memory under test MUT, are provided a first bad block memory BBM and a second bad block memory CFM each having its storage capacity corresponding to the number of blocks that the memory under test has. The results of an initial test are stored in the first bad block memory. Utilizing the results of the initial test as mask data, bad blocks which have been determined to be failure in the initial test are masked by the mask data, respectively, so that a functional test for the bad blocks are omitted and the functional test for only pass blocks is performed. The results of the functional test are stored in the second bad block memory, and only the blocks having their bad block data stored in the second bad block memory are determined as to whether they are repairable or not.

28 Claims, 9 Drawing Sheets

MEMORY TESTING APPARATUS

BACKGROUND OF THE INVENTION

1. Field of the Invention

The present invention relates to a memory testing apparatus for testing a non-volatile memory from which the stored data call be electrically erased ill all bits en bloc or in block by block en bloc and in which data can be rewritten, the non-volatile memory being called, for example, a flash memory, a flash EEPROM or flash E²PROM (flash electrically erasable programmable read only memory), or the like.

2. Description of the Related Art

Among PROMs (programmable read only memories) which are rewritable read only memories is called "flash memory" in this technical field a memory the stored contents of which is replaceable by electrically erasing the stored contents in all bits en bloc or in block by block en bloc and rewriting data therein. As shown in FIG. 8, the inside of this flash memory (for example, NAND type flash memory) is separated into a plurality of blocks (in this example, 1024 blocks of No. 1 to No. 1024). Each of the blocks is constituted by N pages (N is an integer equal to or greater than 2), and each of the N pages is constituted by M bits (M is an integer equal to or greater than 2). Such flash memory is constructed such that the stored contents thereof can be electrically erased not only in all bits en bloc but also in block by block en bloc, and the stored contents thereof can be replaced by rewriting data in one block or in all blocks the stored contents of each of which have. been erased. In general, there are many cases that each block comprises 16 pages (N=16) and each page comprises 512 bits (M=512).

Conventionally, this flash memory is tested and measured by a memory testing apparatus for testing and measuring a commonplace memory (for example, a memory constituted by a semiconductor integrated circuit (IC)). FIG. 9 shows a configuration of a ordinary memory testing apparatus that has conventionally been used.

The illustrated memory testing apparatus comprises a main controller 100, a testing apparatus proper 200.called "main frame" in this technical field and a test head 300. The testing apparatus proper 200 comprises, in this example, a timing generator TG, a pattern generator PG, a waveform formatter FC, drivers DR, a voltage comparator VCP, a logical comparator LOC and a failure analysis memory AFM.

The test head 300 is constructed separately from the testing apparatus proper 200, and a predetermined number of device sockets (not shown) are usually mounted on the top portion of the test head 300. In addition, a printed board called "pin card" in this technical field is accommodated within the test head 300, and a circuit containing the drivers DR and the voltage comparator VCP of the testing apparatus proper 200 is usually formed on this pin card. In general, the test head 300 is mounted to a test section of a semiconductor device transporting and handling apparatus called "handler" in this technical field, and the test head 300 is electrically connected to the testing apparatus proper 200 by signal transmission means such as cables, optical fibers or the like.

A memory to be tested (a memory under test) MUT is mounted on a device socket of the test head 300, through which a test pattern signal is written in the memory under test MUT from the testing apparatus proper 200 and a response signal read out of the memory under test MUT is supplied to the testing apparatus proper 200, thereby to perform the test and the measurement for the memory under test MUT.

Further, in FIG. 9 only the drivers DR are shown in the plural form (four in this example), but, in reality, there are provided a predetermined number of drivers DR, for example 512 drivers. In addition, in FIG. 9, in order to simplify the drawing, each of the components in the main frame 200 (the timing generator TG, the pattern generator PG, the waveform formatter FC, the voltage comparator VCP, the logical comparator LOC and the failure analysis memory AFM) except the drivers DR is shown as one block, but in practice the remaining components in the main frame 200 except the timing generator TG are also provided by the same number (512) as that of the drivers DR, respectively. That is, only the timing generator TG is used in common to each of the pins of the IC under test MUT.

The main controller 100 is constituted by a computer system having its scale of, for example, a workstation or so, and a test program 101 created by a user (programmer) is previously stored therein, and the entire memory testing apparatus is controlled in accordance with the test program 101. The main controller 100 is connected to the timing generator TG, the pattern generator PG, and the like in the main frame 200 via a tester bus 201. A test for the memory under test MUT is carried out in accordance with control instructions/commands outputted from the main controller 100.

A pattern generating sequence described in the test program stored in the main controller 100 is previously stored in the pattern generator TG prior to the start of a test. When a test start instruction is given thereto from the main controller 100, the pattern generator PG outputs test pattern data to be applied to the memory under test MUT in accordance with the stored pattern generating sequence. As the pattern generator PG, an ALPG (Algorithmic Pattern Generator) is generally used. The ALPG is a pattern generator that generates a test pattern to be applied to a semiconductor device (for example, an IC) by an arithmetic and logic operation or computation using internal registers each having an arithmetic and logic function or computing function.

The timing generator TG has timing data previously stored therein prior to the start of a test, the timing data being described in the test program stored in the main controller 100 and outputted for every test period. The timing generator TG outputs a clock pulse (a timing pulse) for each test period in accordance with the stored timing data. This timing pulse is supplied to the waveform formatter FC, the logical comparator LOC and the like.

The waveform formatter FC defines a rise timing and a fall timing of a logical waveform, based on the test pattern data outputted from the pattern generator PG and the timing pulse outputted from the timing generator TG, to produce a test pattern signal having a real waveform that changes from/to logical H (logical "1") to/from logical L (logical "0"). This test pattern signal is applied to the memory under test MUT via the drivers DR.

Each of the drivers DR defines the amplitude of the test pattern signal outputted from the waveform formatter FC to a desired amplitude (logical H, i.e., voltage of logical "1" and logical L, i.e., voltage of logical "0") and applies such test pattern signal to the device socket of the test head 300, thereby to drive the memory under test MUT.

The voltage comparator VCP determines whether or not a logical value of a response signal outputted from the memory under test MUT has a normal voltage value. That is, the voltage comparator VCP determines whether or not a voltage of logical H has a value equal to or greater than a defined voltage value in case of the response signal of logical H and whether or not a voltage of logical L has a value equal to or less than a defined voltage value in case of the response signal of logical L.

In case the determination result of the voltage comparator VCP indicates a good result (pass), the output signal of the voltage comparator VCP is inputted to the logical comparator LOC where it is compared with an expected value pattern data (signal) EXP supplied from the pattern generator PG to determine whether or not the memory under test MUT has outputted a normal response signal. The comparison result of the logical comparator LOC is stored in the failure analysis memory AFM.

When the output signal of the voltage comparator VCP is not in accord with the expected value pattern data, the logical comparator LOC determines a memory cell of the memory under test MUT at the address thereof from which the response signal has been read out to be defective or failure, and generates a failure signal indicating that fact. Usually, when the failure signal is generated, a logical "1" signal being always applied to a data input terminal of the failure analysis memory AFM is enabled to be written in the failure analysis memory AFM, and the logical "1" data is written as a failure data in a memory cell of the failure analysis memory AFM specified by an address signal ADR supplied from the pattern generator PG. In general, a failure data (logical "1") is stored in the same address of the failure analysis memory AFM as that of the failure memory cell of the memory under test MUT.

On the contrary, when the response signal of the memory under test is in accord with the expected value pattern data EXP, the logical comparator LOC determines a memory cell of the memory under test MUT at the address thereof from which the response signal has been read out to be normal, and generates a pass signal indicating that fact. Usually, the pass signal is not stored in the failure analysis memory AFM.

After the test has been completed, a failure analysis of the memory under test MUT is carried out with reference to the failure data stored in the failure analysis memory AFM. For example, in case the failure data are utilized for relief or repair of the failure memory cells, a failure map is created based on the read-out failure data whereby a decision is rendered as to whether or not the relief or repair of the failure memory cells is carried out.

As is well known, the failure analysis memory AFM is constructed by a memory having its storage capacity equal to or more than that of the memory under test MUT so that the failure determination results of all the bits of the memory under test MUT can be stored therein.

Accordingly, even in case of testing a flash memory, heretofore, the failure determination results of all the bits of the flash memory are also stored in the failure analysis memory AFM. After the test has been completed, each of the blocks of the flash memory is discriminated on the basis of an address signal supplied to the failure analysis memory AFM, and then the number of failure memory cells is counted for each block. Thereafter, for example, a failure relief analysis in which a decision is rendered whether the relief for the failure memory cells is possible or not, or the like is carried out.

In case of testing flash memories, an initial test for the flash memories is performed at first. Then, a functional test is performed only for the flash memories that have been determined to be pass articles. The initial test is carried out by way of example as follows: usually a logical value "1" (there may be a case of logical value "0") is written in the memory cells of all the bits of a flash memory under test, and thereafter the written logical values are read out: When a read-out logical value is not in accord with the written logical value, that memory cell is determined to be defective, and a block containing such defective memory cell is determined to be a failure block.

There are many cases that a memory cell having the read-out logical value which has been not in accord with the written logical value in the initial test has a fatal defect and its relief is impossible. For this reason, in general, a block having at least one memory cell which has been determined to be defective in the initial test, namely, a failure block is regarded as an unusable block. If the number of failure blocks having been detected in the initial test is equal to or more than a predetermined number, for example, five or so, that flash memory under test has been determined to be a failure article at the stage of initial test, and any functional test for that flash memory is not performed.

The functional test is applied only to flash memories each having been determined to be a pass article in the initial test because it has less failure blocks than the prescribed value. In the functional test, the operation of writing a test pattern signal only in the blocks each of which has been determined to be pass block in the initial test (hereinafter referred to as pass block) and the operation of reading out the written test pattern signal therefrom are repeated, and the read-out data (that is, the response signal of the flash memory under test) is compared with the written data (that is, an expected value pattern data EXP from the pattern generator PG) in the logical comparator LOC to determine whether they are in accord with each other or not. In case both the data are not in accord with each other, a failure data of usually logical "1" is written, as mentioned above, in the same address of the failure analysis memory-AFM as that of the flash memory under test MUT at which the aforesaid disaccord has occurred to store therein the position of the memory cell where the disaccord has occurred. Then, after the functional test has been completed, the memory contents of the failure analysis memory AFM are read out therefrom to determine whether or not the relief or repair of the flash memory can be performed on the basis of the number of failure memory cells and the positions of failure memory cells.

As described above, in the test of a flash memory, a block having at least one defective memory cell detected in the initial test is determined to be a failure block, and the number of failure blocks is equal to or more than the predetermined number, that flash memory is determined to be a failure article. On the other hand, with respect to flash memories each having less failure blocks than the predetermined number, a functional test is applied only to the pass blocks of each of the flash memories. Consequently, the functional test is not applied to the failure blocks. Hereinafter, the failure block will be referred to as bad block.

For such reason, in the initial test, heretofore, an address area of the failure analysis memory AFM corresponding to each of the blocks of the flash memory under test is sequentially read one address by one address, whether or not data representing a failure (in general, data of logical "1") is written in that address area is inspected, and based on this inspection result, whether or not the number of failures is equal to or greater than the prescribed value is determined. Accordingly, there is a drawback that it takes a long time to inspect failure data and the throughput of the test (efficiency of the test) is very poor.

Moreover, in the functional test for the flash memories subsequent to the initial test, unless the writing of data is correctly performed in each address of a pass block under test, a rewriting operation is repeated several times for each address of the subject pass block until the writing of data is correctly performed. When the number of the rewriting operations reaches a preset number of times, for example, six times or so, the writing of data in the current address is ceased and proceeds to the next address. At the same time, the address in which the writing of data could not have been done is stored in the failure analysis memory AFM as a failure address. Accordingly, there is a drawback that if there is an address in which the writing of data cannot be done at all in a pass block, the time duration required for carrying out the functional test becomes long because the time duration needed for the rewriting operations is added thereto.

Particularly, in case a plurality of flash memories are simultaneously tested, even if there exists only one flash memory that contains a failure address in a pass block, the writing operation for this flash memory is repeated a predetermined number of times when the failure address thereof is accessed. As a result, the remaining flash memories must await until the writing operation for the failure address is repetitively carried out predetermined number of times, notwithstanding that the writing operation for each of the remaining flash memories has been completed only once. Accordingly, there is a serious drawback that the remaining flash memories spend a waste of time, which results in longer test time.

In recent years, in order to reduce a testing cost, many semiconductor memory testing apparatus each being able to test and measure a multiplicity of (for example, 64) semiconductor memories at the same time have appeared, and when many flash memories are simultaneously tested by such a semiconductor memory testing apparatus, there is a strong possibility that at least one flash memory among them includes a failure address in its pass blocks. Accordingly, the aforesaid drawback resulting in longer test time eventually brings about an increase of the testing cost.

SUMMARY OF THE INVENTION

It is an object of the present invention to provide a memory testing apparatus which is capable of significantly reducing a time duration required for inspecting a bad block performed after the completion of the initial test for a non-volatile memory from which the stored data can be electrically erased in all bits en bloc or in block by block en bloc and in which data can be rewritten.

It is another object of the present invention to provide a memory testing apparatus which is capable of performing in a short time, in case of simultaneously testing a plurality of non-volatile memories from each of which the stored data can be electrically erased in all bits en bloc or in block by block en bloc and in each of which data can be rewritten, a functional test for pass blocks performed after the completion of the initial test.

It is further object of the present invention to provide a memory testing apparatus which is able to set therein various kinds of test modes.

In order to accomplish the above objects, in a first aspect of the present invention, there is provided a memory testing apparatus for testing a non-volatile memory from which the stored data can be electrically erased in all bits en bloc or in block by block en bloc and in which data can be rewritten, and comprising: a first bad block memory having its storage areas the number of which corresponds to the number of blocks that a memory under test has; and wherein in an initial test mode in which a constant logical value is written in memory cells of each of all the blocks of the memory under test, the written logical value is read out, a decision is rendered as to whether or not the read-out logical value is in accord with the written logical value, and a block having even one memory cell the read-out logical value from which is in disaccord with the written logical value is detected as a failure block, every time a failure block is detected, bad block data representing the failure block is stored in a storage area of the first bad block memory corresponding to the failure block.

In case of testing a plurality of memories under test at the same time, the aforesaid first bad block memory is provided one for each of the memories under test. In addition, the inside of the non-volatile memory is separated into a plurality of blocks, each of the blocks being constituted by N pages, and each of the N pages being constituted by M bits.

In a first preferred embodiment, the aforesaid memory testing apparatus further comprises block address selecting means for selecting a specified bit or bits from an address signal supplied to the memory under test to produce a block address signal for accessing a storage area of the first bad block memory corresponding to a block to which an address of the memory under test accessed by the address signal belongs.

The aforesaid block address selecting means selects, in a functional test mode, a specified bit or bits from an address signal included in a test pattern signal supplied to the memory under test to produce a block address signal for accessing a storage area of the first bad block memory, thereby to read out from the first bad block memory bad block data stored therein.

The aforesaid memory testing apparatus further comprises: mask control means for inhibiting, when bad block data is read out from the first bad block memory, a functional test for the memory under test from being carried out; and a bad block counter for counting the number of bad block data stored in the first bad block memory after the initial test has been completed.

In a second preferred embodiment, the aforesaid memory testing apparatus further comprises a second bad block memory for storing therein bad block data representing a failure block detected in a functional test mode, and the aforesaid bad block counter counts the number of bad block data stored in each of the first bad block memory and the second bad block memory after the initial test and the functional test have been completed.

With the construction described above, by reading out the storage contents of the first bad block memory, the number of bad blocks of a memory under test can be totalized in extremely short time. Accordingly, the time duration required for carrying out the initial test can significantly be reduced.

In addition, upon performing the functional test, a block address signal is produced from an address signal supplied to the memory under test, the first bad block memory is accessed by this block address signal to read out the storage contents of the first bad block memory, and a read-out bad block data is utilized as a mask data for stopping the functional test. Consequently, when a bad block data is read out, the functional test for a block of the memory under test corresponding to the block from which the bad block data is read out can immediately be inhibited from being performed. Accordingly, the time duration required for carrying out the functional test can be reduced.

Particularly, in case a plurality of memories under test are simultaneously tested, the functional test for a memory under test in which its bad block has been accessed is inhibited from being preformed, and hence the functional test for that bad block is not effected. As a result, it is not necessary to rewrite a test pattern signal repeatedly in the memory under test in which its bad block has been accessed. Accordingly, the remaining memories under test can immediately undergo the functional test without waiting until the lapse of a time duration required for repeatedly rewriting the test pattern signal in the memory under test in which its bad block has been accessed. Therefore, the time duration required for carrying out the functional test can greatly be reduced.

DETAILED DESCRIPTION OF THE PREFERRED EMBODIMENTS

Figure 9:
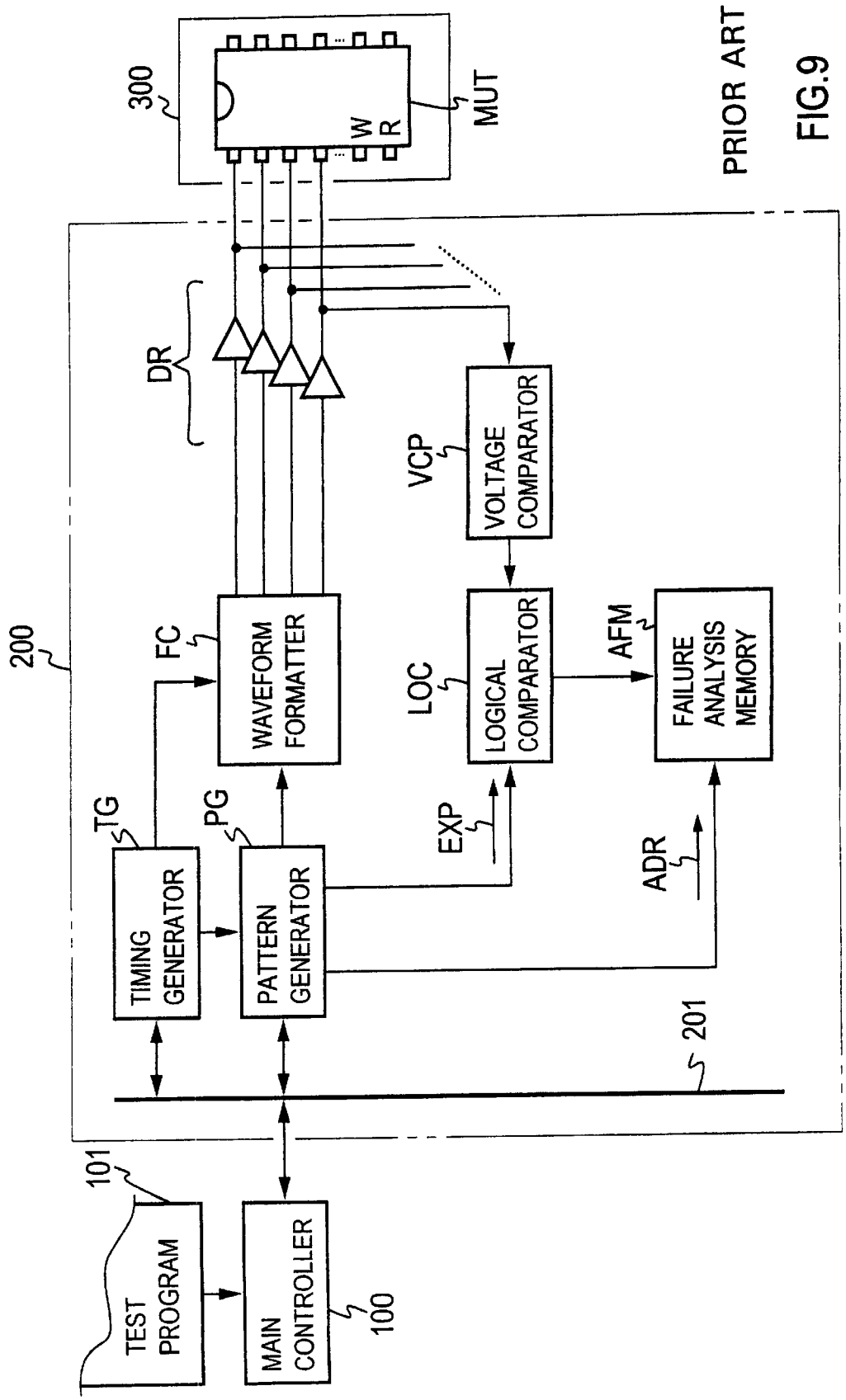
FIG. 9 is a block diagram showing an example of the convention, memory testing apparatus.

Now the preferred embodiments of the memory testing apparatus according to the present invention will be described in detail with reference to FIGS. 1 to 3. Further, portions or elements in FIGS. 1 and 3 corresponding to those in FIG. 9 will be shown by the same reference characters affixed thereto, and the explanation thereof will be omitted unless it is necessary.

Figure 1:
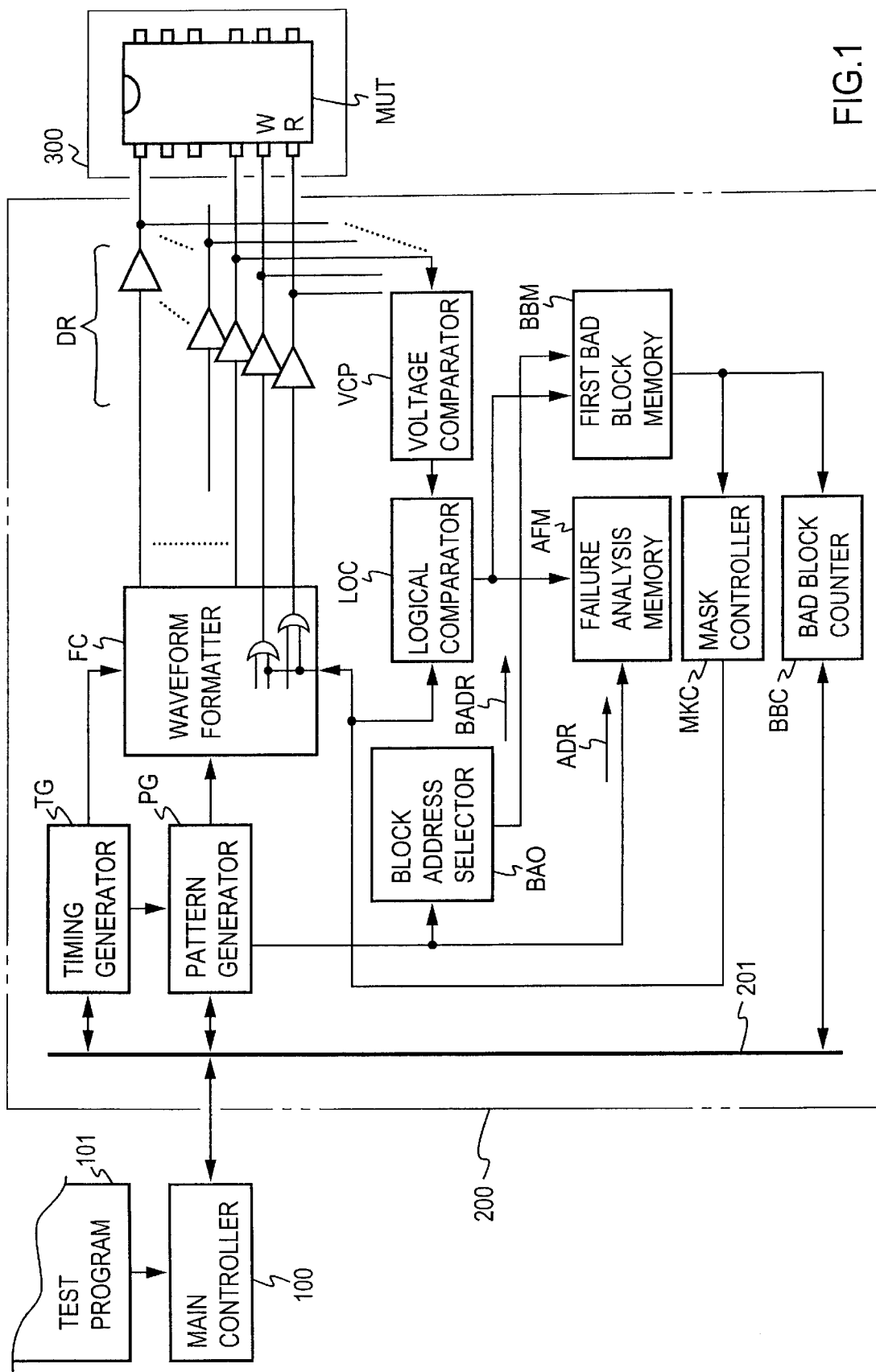
FIG. 1 is a block diagram showing a first embodiment of the memory testing apparatus according to the present invention.

FIG. 1 shows, in block diagram form, a first embodiment of the memory testing apparatus according to the present invention. Like the conventional memory testing apparatus shown in FIG. 9, the memory testing apparatus of the first embodiment is also constituted by a main controller 100, a testing apparatus proper 200 called "main frame" in this technical field, and a test head 300. The testing apparatus proper 200 comprises a timing generator TG, a pattern generator PG, a waveform formatter FC, drivers DR, a voltage comparator VCP, a logical comparator LOC, and a failure analysis memory AFM.

A memory to be tested (memory under test) MUT is mounted on a device socket of the test head 300, through which a test pattern signal outputted from the testing apparatus proper 200 is written in the memory under test MUT, and also a response signal read out from the memory under test MUT is supplied to the testing apparatus proper 200, thereby to test and measure the memory under test MUT.

Further, in FIG. 1, only the drivers DR are shown in the plural form, but, in reality, a predetermined number, for example, 512 of the drivers DR are provided. In addition, the pattern generator PG, the waveform formatter FC, the voltage comparator VCP, the logical comparator LOC and the failure analysis memory AFM in the main frame 200 except the timing generator TG are also provided by the same number (for example, 512) as that of the drivers DR, respectively.

The memory testing apparatus of the first embodiment according to the present invention is characterized in that there are provided, in addition to the failure analysis memory AFM conventionally used, a first bad block memory BBM, a block address selector BAO, a mask controller MKC and a bad block counter BBC.

The first bad block memory BBM is accessed by a block address constituted by a bit or bits selected out of an address signal having all bits (full bits). In the first embodiment shown in FIG. 1, the memory testing apparatus is constructed such that the full bit address signal ADR supplied to the failure analysis memory AFM from the pattern generator PG is also supplied to the block address selector BAO where the most significant bit or higher order bits including the most significant bit are extracted out of the full bit address signal ADR to produce a block address signal BADR, and the block address signal BADR is supplied to the first bad block memory BBM from the block address selector BAO, thereby to access an address of the first bad block memory is BBM specified by the block address signal.

The full bit address signal ADR supplied to the failure analysis memory AFM is the same as an address signal supplied to the memory under test MUT in both cases of carrying out the initial test and the functional test. Therefore, when a data (a test pattern data) written in the memory under test MUT is read out therefrom, the same addresses of the memory under test MUT and the failure analysis memory AFM are accessed by the same address signal. On the contrary, the first bad block memory BBM is configured such that a block address corresponding to a block No. to which the accessed address of the memory under test MUT belongs is accessed by the block address signal BADR.

Figure 2:
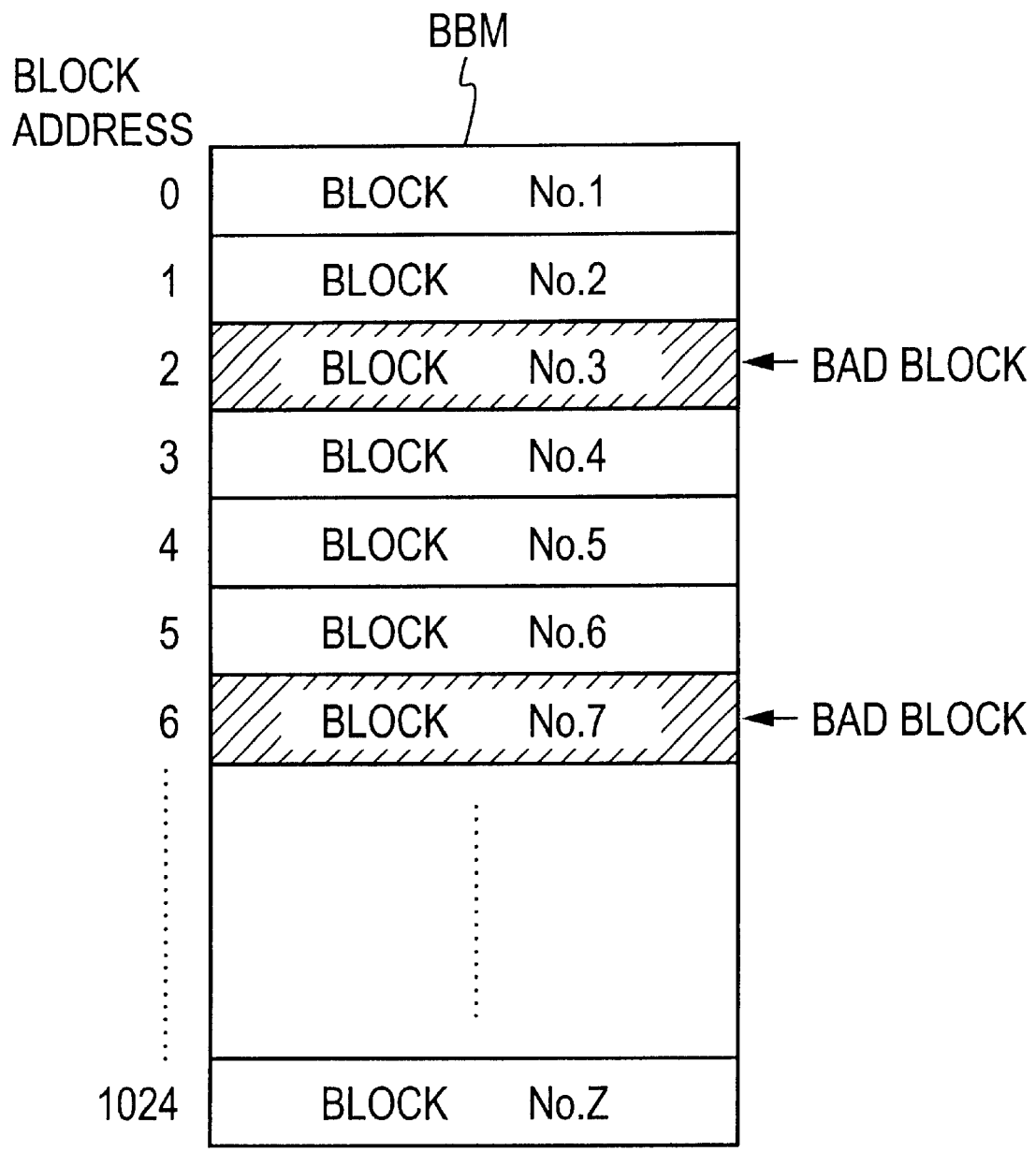
FIG. 2 is a diagram for explaining a construction of the first bad block memory used in the memory testing apparatus shown in FIG. 1.

Accordingly, in case a data read out from the memory under test MUT is not in accord with an expected value pattern data outputted from the pattern generator PG, the address at which such disaccord has occurred and the position of the memory cell from which the disaccord has occurred are stored in the failure analysis memory AFM, and at the same time, as shown in FIG. 2, a data representing a bad block (bad block data) is written in a block No. in the first bad block memory BBM, to which the address at which the disaccord has occurred belongs. The example of FIG. 2 shows that the disaccord has occurred in addresses of blocks of the memory under test MUT belonging to block addresses 2 and 6 respectively, bad block data are written in blocks No. 3 and No. 7 corresponding to these block addresses 2 and 6 respectively, and hence these blocks No. 3 and No. 7 are bad blocks.

FIG. 1 shows by way of example a configuration for testing one memory under test MUT. In case a plurality of memories under test MUT are tested, there are provided, for each memory under test MUT, the pattern generator PG, the waveform formatter FC, the drivers DR, the voltage comparator VCP, the logical comparator LOC, the failure analysis memory AFC, the first bad block memory BBM, the mask controller MKC, the block address selector BAO and the block address counter BBC.

In the initial test, a logical value of, for example, "1" is written in all the bits of the memory under test MUT, and then the logical value is read out in regular sequence. If there is detected in each block even one memory cell from which the disaccord has occurred, data (in general, data of logical "1") representing the bad block is written in a block address of the first bad block memory BBM representing that block. This data representing the bad block can be expressed by one bit data. Therefore, the first bad block memory BBM may be constituted by a memory having its address capacity the number of addresses of which is equal to the number of blocks of the memory under test MUT and having its storage capacity of one bit per each address.

When the initial test has been completed, the pattern generator PG supplies an address signal to the block address selector BAO so that a block address signal is supplied from the block address selector BAO to the first bad block memory BBM to read out bad block data stored in the first bad block memory BBM.

The bad block data read out from the first bad block memory BBM is counted by the bad block counter BBC. This counted result is read in the main controller 100 via the tester bus 201 so that whether the memory under test MUT is defective or not is determined. In case the number of bad blocks is less than a predetermined number, the main controller 100 instructs the pattern generator PG and the timing generator TG to carry out the functional test.

During the functional test, the pattern generator PG outputs test pattern data in accordance with the pattern generating sequence described in the test program 101, and the waveform formatter FC produces a test pattern signal having a real waveform based on the test pattern data and a timing signal outputted from the timing generator TG. This test pattern signal is written in each of the addresses (memory cells) of the memory under test MUT via the drivers DR. The written test pattern signal is read out later on and is sent to the voltage comparator VCP.

In this case, each of the test pattern data outputted from the pattern generator PG has an address signal to be supplied to both the memory under test MUT and the failure analysis memory AFM added thereto. The address signal supplied to the failure analysis memory AFM is also supplied to the block address selector BAO so that a block address signal BADR is generated from the block address selector BAO. The storage contents of the first bad block memory BBM are read out by the block address signal BADR.

If any bad block data is not read out from the first bad block memory BBM, the functional test is performed as usual, and a logical comparison result is outputted from the logical comparator LOC. On the contrary, if a bad block data is read out from the first bad block memory BBM, this bad block data is supplied to both the waveform formatter FC and the logical comparator LOC via the mask controller MKC. Upon receiving the bad block data, the waveform formatter FC supplies an inhibit signal of logical "1" or logical "0" to at least signal lines connected to a write control terminal W and a read control terminal R, thereby to inhibit the writing operation in and the reading operation from the memory under test MUT from being carried out. On the other hand, the logical comparator LOC is inhibited from performing its operation of logical comparison.

Since the memory testing apparatus according to the present invention is constructed in such manner, when a decision is rendered as to whether the memory under test MUT is defective or not after completion of the initial test, it is sufficient that only the storage contents of the first bad block memory BBM are read out therefrom. Consequently, there is obtained an advantage that the time duration inspecting a bad block becomes very short as compared with a case where the conventional memory testing apparatus is used, and hence the testing efficiency is improved.

In addition, since the memory testing apparatus according to the present invention is constructed such that the bad blocks are masked by the bad block data stored in the first bad block memory BBM, it can be surely and quickly performed with simple construction to inhibit the writing/reading operations in/from the bad blocks of the memory under test MUT from being carried out and to inhibit the operation of logical comparison in the logical comparator LOC from being carried out. As a result, during the functional test, the writing/reading operations in/from the bad blocks and the operation of logical comparison are inhibited at once from being performed, and hence a time duration required for carrying out the functional test can be reduced. Particularly, in case many memories under test are tested at the same time, even if several memories under test have at least one bad block and any one or more of the bad blocks is accessed, the functional test for the bad block or blocks is inhibited from being performed. As a result, the functional test for the pass blocks of the remaining memories under test can be carried out without any waiting time. Accordingly, in case many memories under test are simultaneously tested, there is obtained an advantage that the time duration required for carrying out the test can greatly be reduced.

Figure 3:
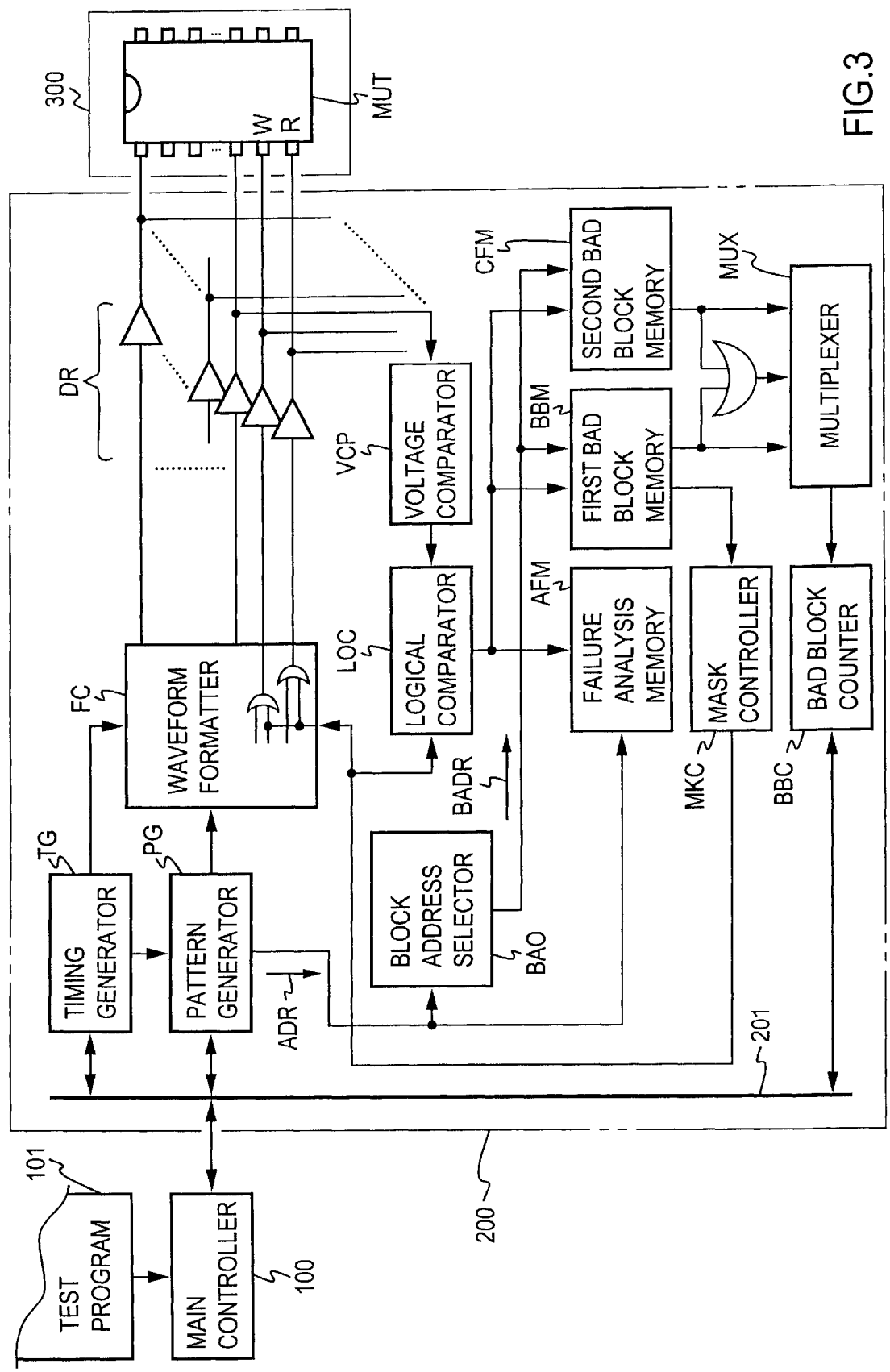
FIG. 3 is a block diagram showing a second embodiment of the memory testing apparatus according to the present invention.

FIG. 3 is a block diagram showing a second embodiment of the memory testing apparatus according to the present invention. This memory testing apparatus of the second embodiment is characterized in that a second bad block memory CFM is further added to the construction of the first embodiment shown in FIG. 1. As the second bad memory CFM, a memory having the same configuration as that of the first bad block memory BBM is used.

In the second embodiment, as mentioned above, data (data of logical "1") representing a bad block detected in the initial test is also written in the first bad block memory BBM. On the contrary, in the second bad block memory CFM that is added in this embodiment is stored data representing a bad block detected in the functional test.

In the functional test, as discussed in the first embodiment, bad block data stored in the first bad block memory BBM is read out therefrom, and the bad block data is used as a mask data to inhibit the functional test for the bad blocks from being carried out so that the functional test only for pass blocks is carried out. In the second embodiment, if a failure address occurs during the functional test for any one of the pass blocks, data representing the bad block is stored in a block address of the second bad block memory CFM corresponding to the block No. to which the failure address belongs. Accordingly, by reading out the bad block data stored in the second bad block memory CFM, a failure block or blocks, i.e., a bad block or blocks that has been newly detected in the functional test can be recognized.

In this manner, by storing the bad block data detected in the initial test and the bad block data detected in the functional test respectively in the first bad block memory BBM and the second bad block memory CFM separately from each other, various kinds of test modes can be set. Next, several test modes will be described in detail with reference to FIGS. 4 to 7.

Figure 4:
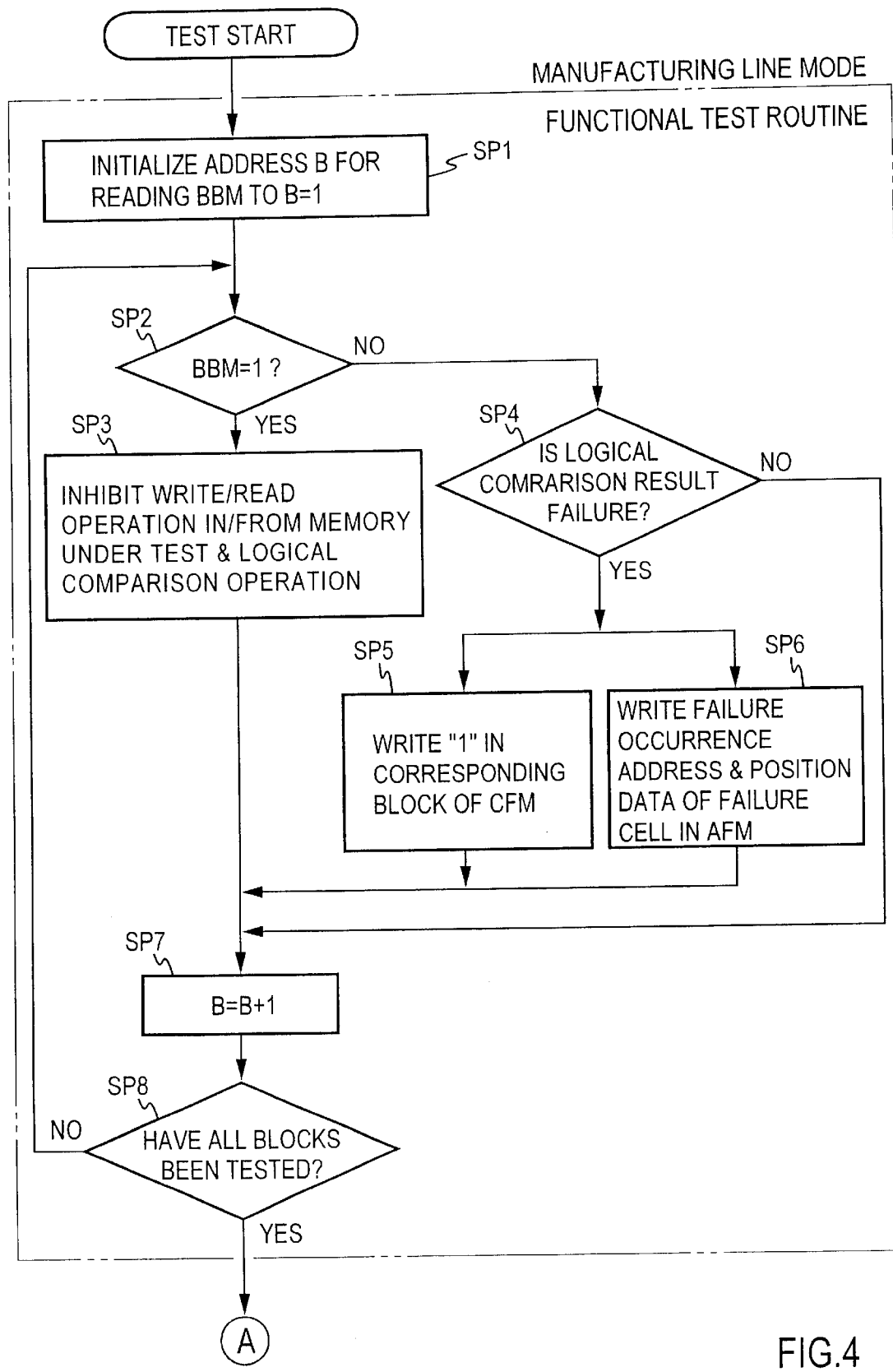
FIG. 4 is a flow chart for explaining the first half portion of a first example of the test mode implemented in the memory testing apparatus shown in FIG. 3.
Figure 5:
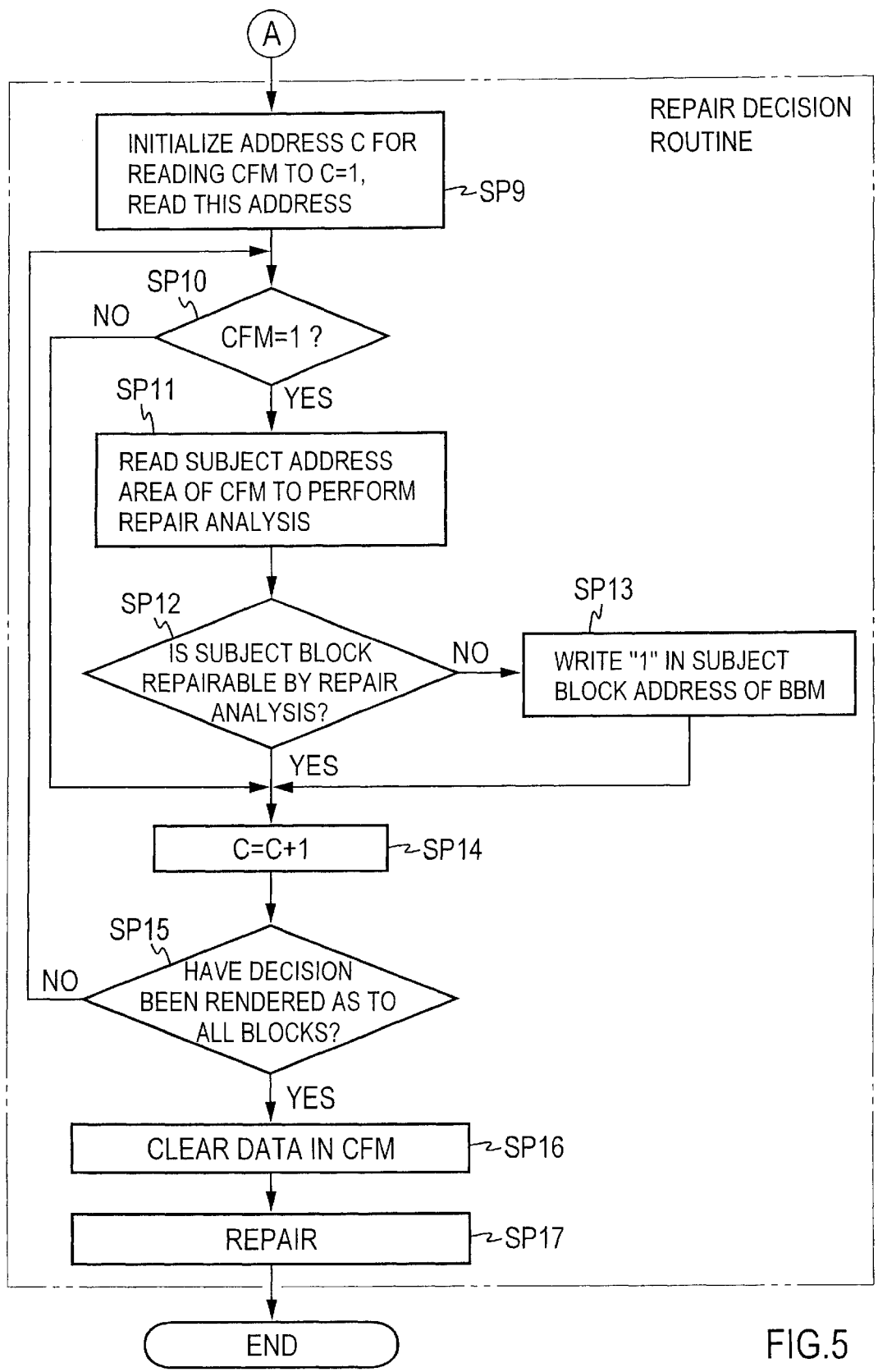
FIG. 5 is a flow chart for explaining the second or latter half portion of the first example of the test mode implemented in the memory testing apparatus shown in FIG. 3.

FIGS. 4 and 5 show an example of the flow chart for setting a test mode used in a manufacturing line (manufacturing line mode) for determining whether each of the blocks of a memory under test can be relieved or not. FIG. 4 shows a functional test routine corresponding to the first half portion of this test mode, and FIG. 5 shows a repair decision routine corresponding to the second or latter half portion thereof. Further, it is assumed that prior to executing the functional test routine shown in FIG. 4, the aforementioned initial test has been performed, and one or more bad block data have been stored in the first bad block memory BBM.

First, in step SPI shown in FIG. 4, a block address B for reading the first bad block memory BBM is initialized to 1 (B=1), and one or more data stored in the block having this address 1 is read out therefrom.

In the next step SP2, a decision is rendered as to whether or not bad block data is read out from the block having the block address 1 in the first bad block memory BBM (BBM= 1?).

If the bad block data is read out (YES, i.e., BBM=1), the process proceeds to step SP3 in which the writing/reading operations in/from the memory under test MUT is inhibited from being carried out, and at the same time logical comparator LOC is inhibited from performing the logical comparison operation. Then, the process proceeds to step SP7.

If any bad block data is not read out (NO, i.e., BBM≠1) in the step SP2, the process proceeds to step SP4. In this step SP4, a decision is rendered as to whether a logical comparison result between a response signal outputted from the memory under test MUT and an expected value pattern data EXP outputted from the pattern generator PG in the functional test indicates a failure or not. In case the logical comparison result indicates a failure (YES), the process proceeds to steps SP5 and SP6. In the step SP5, bad block data ("1") is written in a corresponding block of the second bad block memory CFM. On the other hand, in the step SP6, a failure occurrence address and position data of a failure memory cell are written in the failure analysis memory AFM. Thereafter, the process proceeds to step SP7.

In the step SP4, if the logical comparison result between the response signal and the expected value pattern data in the functional test does not indicate a failure (NO), the process proceeds to directly step SP7.

In this step SP7, the block address B for reading the first bad block memory BBM is incremented by "+1" (B=2), and the process proceeds to step SP8.

In the step SP8, a decision is rendered as to whether or not the data in all of the blocks of the first bad block memory BBM have been read out (whether or not the functional test has been executed for all of the pass blocks of the memory under test). If the data in all of the blocks have not been read out yet (NO), the process returns to the step SP2 to perform the reading operation of data from the block address 2 of the first bad block memory BBM. Thereafter, the functional test operations mentioned above are repeated.

In the step SP8, in case the data in all of the blocks of the first bad block memory BBM have been read out (YES), the functional test is finished, and the process proceeds to the repair decision routine shown in FIG. 5

In this repair decision routine, a block address C for reading the second bad block memory CFM is initialized to 1 (C=1) in step SP9, and one or more data stored in the block having this block address 1 is read out therefrom, and then the process proceeds to step SP10.

In the step SP10, a decision is rendered as to whether or not one or more bad block data is read out from the block having the block address 1 (CFM=1?) in the second bad block memory CFM. In case bad block data is read out (YES, i.e., CFM=1), the process proceeds to step SP11. In case bad block data is not read out (NO, i.e., CFM≠1) in the step SP10, the process proceeds to step SP14.

In the step SP 11, an address area of the failure analysis memory AFM corresponding to the block having the block address 1 of the second bad block memory CFM is read, and a repair analysis for the read-out failure memory cell or cells is performed, and then the process proceeds to step SP 12.

In the step SP 12, a decision is rendered as to whether the result of the repair analysis in the preceding step SP11 makes the relief or repair of the failure memory cell or cells possible or not. For example, if the number of failure memory cells is more than a prescribed value, a decision is rendered that that block is not repairable (NO), and the process proceeds to step SP13. In the step SP13, bad block data ("1") is written in the corresponding block of the first bad block memory BBM, and the process proceeds to step SP14. If that block is repairable (YES), the process proceeds to directly step SP14.

In the step SP 14, the block address C for reading the second bad block memory CFM is incremented by "+1" (C=2), and the process proceeds to step SP15.

In the step SP15, a decision is rendered as to whether the decision of repairability has been rendered as to all of the blocks of the second bad block memory CFM or not. If not (NO), the process returns to the step SP10. If the decision of repairability has been rendered as to all of the blocks (YES), the process proceeds to step SP16.

In the step SP16, the data stored in each of the blocks of the second bad block memory CFM is cleared, and in the next step SP17, a repairing or relieving process is done for the repairable block or blocks of the memory under test. Thus, the repair decision routine ends.

In this manner, by storing the bad block data in the first bad block memory BBM; and the second bad block memory CFM separately from each other, in the functional test routine, a decision can be rendered as to whether a block is subject to the functional test or not, utilizing the bad block data stored in the first bad block memory BBM. Likewise, in the repair decision routine, a decision can be rendered as to whether or not it is a block the failure memory cell or cells of which is determined to be repairable or not repairable, utilizing the bad block data stored in the second bad block memory CFM. For this reason, not only the processing speed of the functional test routine but also the processing speed of the repair decision routine can be increased.

Figure 6:
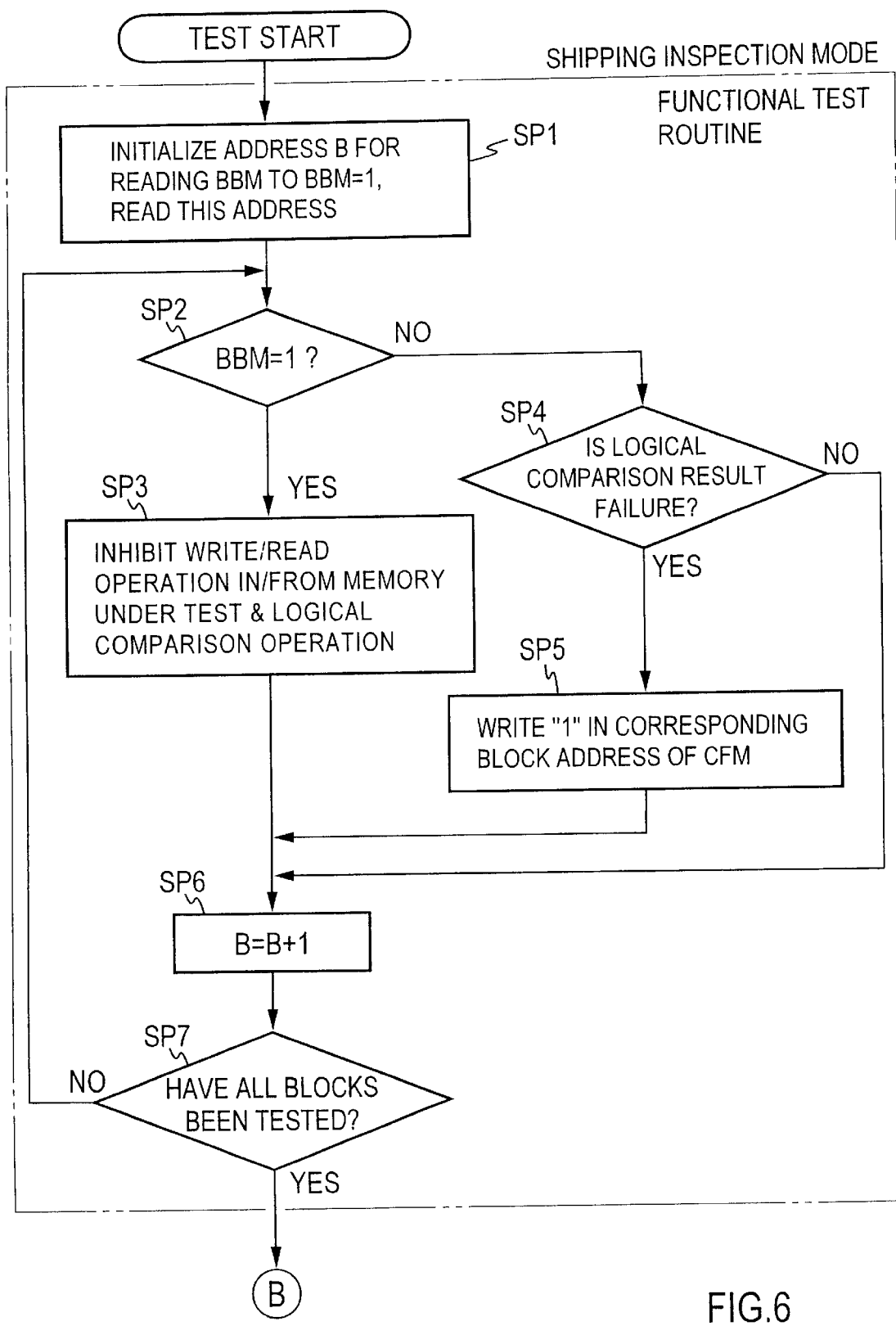
FIG. 6 is a flow chart for explaining the first half portion of a second example of the test mode implemented in the memory testing apparatus shown in FIG. 3.
Figure 7:
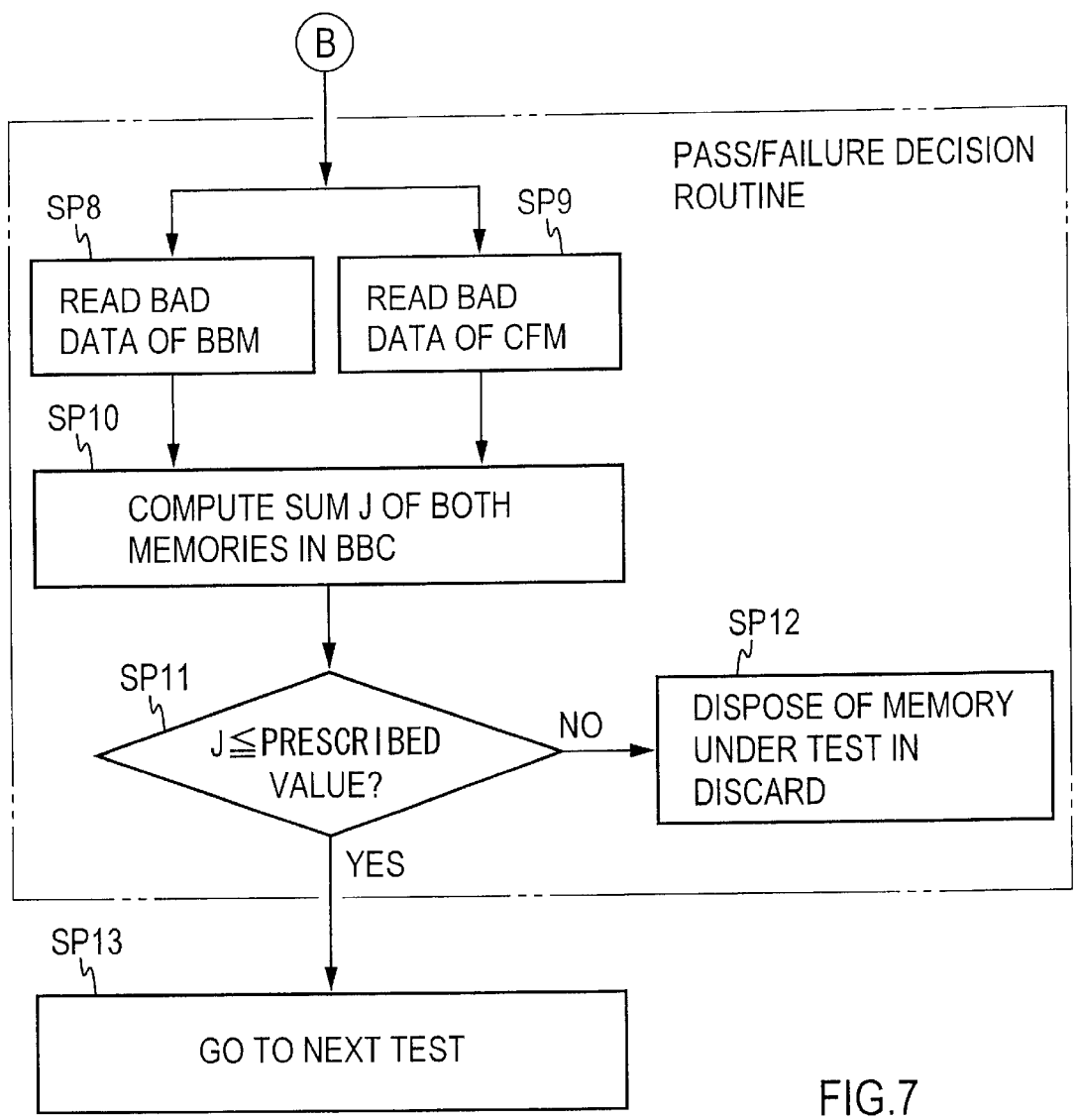
FIG. 7 is a flow chart for explainiiig the second or latter half portion of the second example of the test mode implemented in the memory testing apparatus shown in FIG. 3.
Figure 8:
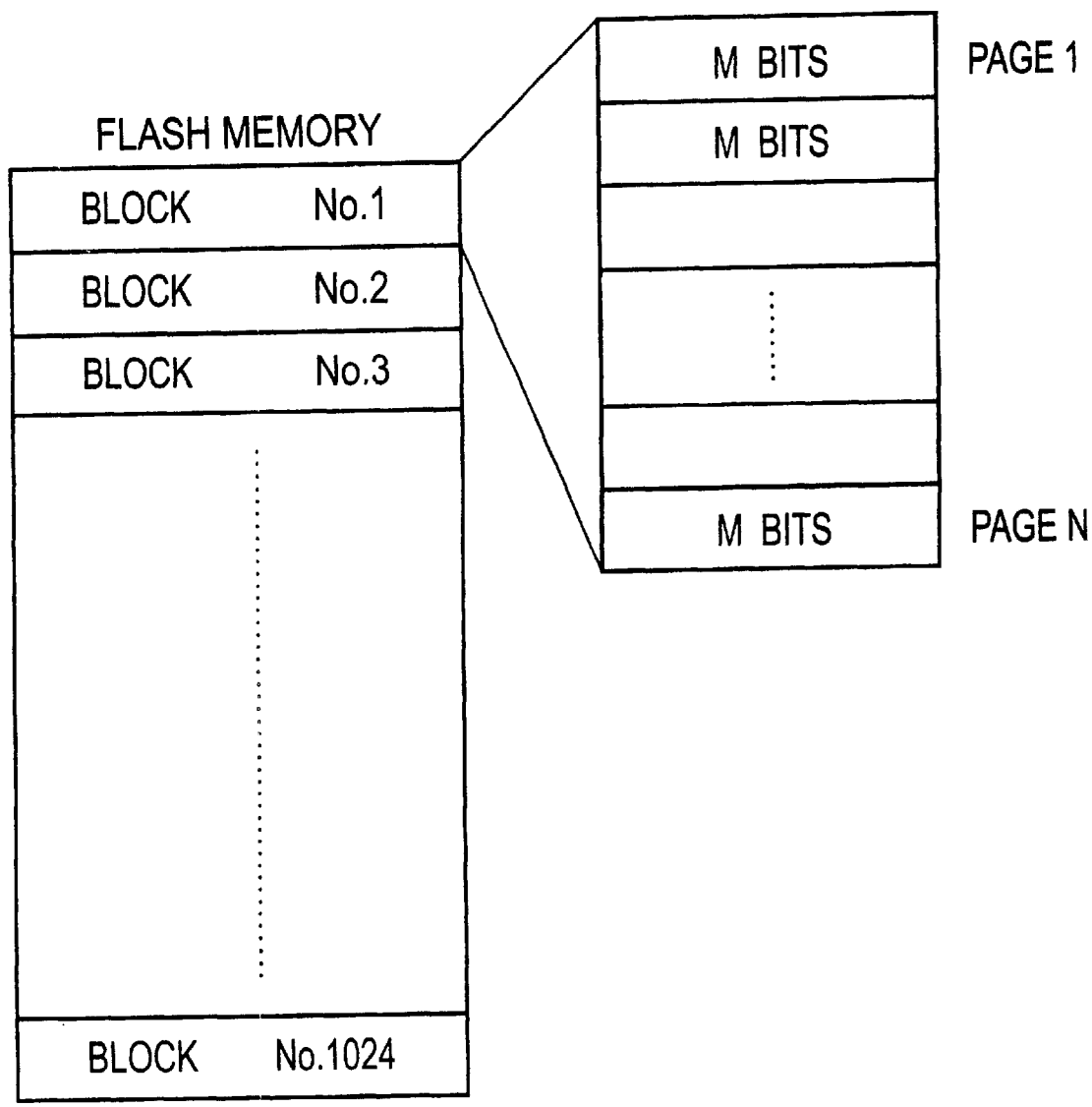
FIG. 8 is a diagram for explaining an example of the construction of a flash memory to be tested by the memory testing apparatus according to the present invention.

FIGS. 6 and 7 show an example of the flow chart for setting a test mode for executing a shipping inspection (shipping inspection mode) by which memories are classified into pass articles and failure articles in shipping the memories. FIG. 6 shows a functional test routine corresponding to the first half portion of this test mode, and FIG. 7 shows a pass/failure decision routine corresponding to the second or latter half portion thereof.

In this shipping inspection mode, the functional test routine shown in FIG. 6 is almost the same as the functional test routine in the aforesaid manufacturing line mode. First, in step SPI, a block address B for reading the first bad block memory BBM is initialized to 1 (B=1), and one or more data stored in the block having this address 1 is read out therefrom.

In the next step SP2, a decision is rendered as to whether or not bad block data is read out from the block having the block address 1 (BBM=1?) in the first bad block memory BBM.

If the bad block data is read out (YES), the process proceeds to step SP3 in which the writing/reading operations in/from the memory under test MUT is inhibited from being carried out, and at the same time logical comparator LOC is inhibited from performing the logical comparison operation. Then, the process proceeds to step SP6.

If any bad block data is not read out (NO) in the step SP2, the process proceeds to step SP4 in which a decision is rendered as to whether a logical comparison result between a response signal outputted from the memory tinder test MUT and an expected value pattern data EXP outputted from the pattern generator PG in the functional test indicates a failure or not. In case the logical comparison result indicates a failure (YES), the process proceeds to step SP5 where bad block data ("1") is written in a corresponding block of the second bad block memory CFM. Thereafter, the process proceeds to step SP6.

In the step SP4, if the logical comparison result between the response signal and the expected value pattern data does not indicate a failure (NO), the process proceeds to directly step6.

In the step SP6, the block address B for reading the first bad block memory BBM is incremented by "+1" (B=2), and the process proceeds to step SP7.

In the step SP7, a decision is rendered as to whether or not the data in all of the blocks of the first bad block memory BBM have been read out (whether or not the functional test has been executed for all of the pass blocks of the memory under test). If the data in all of the blocks have not been read out yet (NO), the process returns to the step SP2 to perform the reading operation of data from the block address 2 of the first bad block memory BBM. Thereafter, the functional test operations mentioned above are repeated.

In the step SP7, if the data in all of the blocks of the first bad block memory BBM have been read out (YES), the functional test is finished, and the process proceeds to the pass/failure decision routine shown in FIG. 7.

In this pass/failure decision routine, in step SP8, the bad data is read out from each of the blocks of the first bad block memory BBM. At the same time, in step SP9, the bad data is read out from each of the blocks of the second bad block memory CFM. The bad block data read out from both of the first bad block memory BBM and the second bad block memory CFM are counted by the bad block counter BBC in step SP10. In this case, the bad block data read out from the same addresses of both of the first bad block memory BBM and the second bad block memory CFM are counted as one bad block data, and the sum J of the bad block data having been read out from both of the bad block memories is found. Thereafter, the process proceeds to step SP11.

In the step SP11, a decision is rendered as to whether the sum J of the bad block data is less than a prescribed value, for example, "5", or equal to or greater than the prescribed value "5". If the sum. J of the bad block data is equal to or greater than the prescribed value "5" (J≧5) (NO), the process proceeds to step SP12 in which the memory under test is determined to be a failure article, which memory under test is disposed in discard. On the contrary, if the sum J of the bad block data is less than the prescribed value "5" (J<5), the process proceeds to step SP13 to go to the next test.

In such manner, according to the construction of the second embodiment, there is a further advantage that various kinds of test modes can be set.

As is apparent from the foregoing description, in the present invention, the memory testing apparatus is constructed such that there is provided the first bad block memory having its storage capacity corresponding to the number of blocks that a flash memory under test has, in addition to the failure analysis memory, and the result of the initial test is stored in the first bad block memory. Accordingly, only by reading out the bad block data stored in the first bad block memory, the number of bad blocks can immediately be recognized. As a result, the pass/failure decision of the memory under test in the stage of the initial test can be quickly rendered, which results in an advantage that a time duration required for carrying out the initial test can remarkably be reduced.

In addition, by utilizing the bad block data stored in the first bad block memory, in the functional test to be next carried out, a decision can be rendered at once as to whether it is a block which is subject to the functional test or a block which is not subject to the functional test. Therefore, there is also obtained an advantage that a time duration required for carrying out the functional test can be reduced. Moreover, by utilizing the bad block data stored in the first bad block memory as mask data, in case the functional tests for the pass blocks are done, the functional tests for the bad blocks can instantaneously be inhibited from being carried out. Due to the mask operation by use of the mask data, in case of testing in parallel a plurality of, particularly, a multiplicity of flash memories such as 32 or 64 flash memories at the same time, the functional tests for the pass blocks can be performed without waiting time. As a result, there is obtained a remarkable advantage that the time duration required for carrying out the functional test can greatly be reduced, and hence the entire testing time can significantly be reduced.

Furthermore, if a second bad block memory is provided in addition to the first bad block memory, bad block data produced in the functional test can be stored in this second bad block memory. As a result, by utilizing the bad block data stored in the second bad block memory, various kinds of test modes can be set. For example, in case a decision process is executed as to whether or not each of the blocks of a memory under test is repairable, a test mode can be set, in which only the block or blocks of the memory under test having the bad block data stored in the second bad block memory are selected to analyze and determine whether or not the block or blocks are repairable. Consequently, there is obtained an excellent functional effect that the time duration required for executing the repair analysis and the decision process can be reduced.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A memory testing apparatus for testing a non-volatile memory that includes a plurality of memory blocks each including a plurality of memory cells in which stored data can be electrically erased in one or more of the blocks and rewritten, said memory testing apparatus comprising:

a pattern generator;

a failure analysis memory; and a first bad block memory having its storage areas the number of which corresponds to the number of blocks that a memory under test has; and wherein the memory-testing apparatus operates in an initial test mode in which a constant logical value is written in memory cells of each of all the blocks of the memory under test, the written logical value is read out, a decision is rendered whether a memory cell is defective according to whether the read-out logical value is in disaccord with the written logical value, failure data is written into the failure analysis memory for memory cells that are decided to be defective, each block having even one memory cell the read-out logical value from which is in disaccord with the written logical value is detected as a failure block, and bad block data representing said failure blocks are stored in a storage area of said first bad block memory corresponding to said failure blocks.

2. The memory testing apparatus according to claim 1, wherein in case of testing a plurality of memories under test at the same time, the first bad block memory is provided one for each of the memories under test.

3. The memory testing apparatus according to claim 1, further comprising block address selecting means for selecting a specified bit or bits from an address signal supplied to the memory under test to produce a block address signal for accessing a storage area of said first bad block memory corresponding to a block to which an address of the memory under test accessed by said Giddiness signal belongs.

4. The memory testing apparatus according to claim 3, wherein said block address selecting means selects, in a functional test mode, a specified bit or bits from an address signal included in a test pattern signal supplied to the memory under test to produce a block address signal for accessing a storage area of said first bad block memory, thereby to read out from said first bad block memory bad block data stored therein.

5. The memory testing apparatus according to claim 3, further comprising mask control means for inhibiting, when bad block data is read out from said first bad block memory, a functional test for the memory under test from being carried out.

6. The memory testing apparatus according to claim 5, further comprising a bad block counter for counting, after the initial test has been completed, the number of bad block data stored in said first bad block memory.

7. The memory testing apparatus according to claim 6, further comprising a second bad block memory for storing therein bad block data representing a failure block detected in a functional test mode.

8. The memory testing apparatus according to claim 5, further comprising a second bad block memory for storing therein bad block data representing a failure block detected in a functional test mode.

9. The memory testing apparatus according to claim 8, further comprising a bad block counter for counting, after the initial test and the functional test have been completed, the number of bad block data stored in each of said first bad block memory and said second bad block memory.

10. The memory testing apparatus according to claim 3, further comprising a bad block counter for counting, after the initial test has been completed, the number of bad block data stored in said first bad block memory.

11. The memory testing apparatus according to claim 10, further comprising a second bad block memory for storing therein bad block data representing a failure block detected in a functional test mode.

12. The memory testing apparatus according to claim 3, further comprising a second bad block memory for storing therein bad block data representing a failure block detected in a functional test mode.

13. The memory testing apparatus according to claim 12, further comprising a bad block counter for counting, after the initial test and the functional test have been completed, the number of bad block data stored in each of said first bad block memory and said second bad block memory.

14. The memory testing apparatus according to claim 2, wherein address selecting means for selecting a specified bit or bits from an address signal supplied to the memory under test to produce a block address signal for accessing a storage area of said first bad block memory corresponding to a block to which an address of the memory under test accessed by the address signal belongs is provided one for each of the memories under test.

15. The memory testing apparatus according to claim 2, wherein mask control means for inhibiting, when bad block data is read out from said first bad block memory, a functional test for the memory under test from being carried out is provided one for each of the memories under test.

16. The memory testing apparatus according to claim 2, wherein a bad block counter for counting, after the initial test has been completed, the number of bad block data stored in said first bad block memory is provided one for each of the memories under test.

17. The memory testing apparatus according to claim 2, wherein a second bad block memory for storing therein bad block data representing a failure block detected in a functional test mode is provided one for each of the memories under test.

18. The memory testing apparatus according to claim 2, wherein a bad block counter for counting, after the initial test and a functional test have been completed, the number of bad block data stored in each of said first bad block memory and a second bad block memory is provided one for each of the memories under test.

19. The memory testing apparatus according to claim 1, further comprising mask control means for inhibiting, when bad block data is read out from said first bad block memory, a functional test for the memory under test from being carried out.

20. The memory testing apparatus according to claim 19, further comprising a bad block counter for counting, after the initial test has been completed, the number of bad block data stored in said first bad block memory.

21. The memory testing apparatus according to claim 20, further comprising a second bad block memory for storing therein bad block data representing a failure block detected in a functional test mode.

22. The memory testing apparatus according to claim 19, further comprising a second bad block memory for storing therein bad block data representing a failure block detected in a functional test mode.

23. The memory testing apparatus according to claim 22, further comprising a bad block counter for counting, after the initial test and the functional test have been completed, the number of bad block data stored in each of said first bad block memory and said second bad block memory.

24. The memory testing apparatus according to claim 1, further comprising a bad block counter for counting, after the initial test has been completed, the number of bad block data stored in said first bad block memory.

25. The memory testing apparatus according to claim 24, further comprising a second bad block memory for storing therein bad block data representing a failure block detected in a functional test mode.

26. The memory testing apparatus according to claim 1, further comprising a second bad block memory for storing therein bad block data representing a failure block detected in a functional test mode.

27. The memory testing apparatus according to claim 26, further comprising a bad block counter for counting, after the initial test and the functional test have been completed, the number of bad block data stored in each of said first bad block memory and said second bad block memory.

28. The memory testing apparatus according to claim 1, wherein the inside of said non-volatile memory is separated into a plurality of blocks, each of the blocks being constituted by N pages (N is an integer equal to or greater than 2), and each of the N pages being constituted by M bits (M is an integer equal to or greater than 2).

* * * * *